(12) United States Patent
Hussaini

(10) Patent No.: US 6,411,514 B1
(45) Date of Patent: Jun. 25, 2002

(54) POWER INVERTER WITH HEAT DISSIPATING ASSEMBLY

(75) Inventor: Saied Hussaini, Miami, FL (US)

(73) Assignee: Rally Manufacturing, Inc., Miami, FL (US)

( * ) Notice: Subject to any disclaimer, the term of this patent is extended or adjusted under 35 U.S.C. 154(b) by 0 days.

(21) Appl. No.: 09/800,492

(22) Filed: Mar. 8, 2001

(51) Int. Cl.[7] ................................................ H05K 7/20
(52) U.S. Cl. ...................... 361/704; 361/688; 361/689; 361/690; 361/694; 361/695; 361/697; 361/707; 361/719; 174/16.1; 174/16.3; 165/80.3; 165/104.33; 165/185
(58) Field of Search ................................ 361/690, 695, 361/694, 704, 707, 709, 710, 719, 720; 165/80.1, 80.3, 104.33, 185; 174/16.1, 16.3

(56) References Cited

U.S. PATENT DOCUMENTS

| | | |
|---|---|---|
| 3,851,226 A | 11/1974 | Chen |
| 4,471,898 A | 9/1984 | Parker |
| 4,525,769 A | 6/1985 | Lehmann |
| 4,546,407 A | 10/1985 | Benenati |
| 4,656,559 A | 4/1987 | Fathi |
| 4,710,853 A | 12/1987 | Reinhardt |
| 5,170,336 A * | 12/1992 | Getter et al. ................ 361/141 |
| 5,461,542 A | 10/1995 | Kosak et al. |
| 5,521,792 A | 5/1996 | Pleitz et al. |
| 5,659,459 A * | 8/1997 | Wakabayashi et al. ...... 361/753 |
| 5,742,478 A * | 4/1998 | Wu ............................ 361/704 |
| 5,909,358 A * | 6/1999 | Bradt ......................... 361/704 |
| 6,101,090 A * | 8/2000 | Gates ......................... 361/690 |
| 6,292,363 B1 * | 9/2001 | Shinohara et al. .......... 361/695 |

* cited by examiner

Primary Examiner—Boris Chervinsky
(74) Attorney, Agent, or Firm—Liniak, Berenato, Longacre & White

(57) ABSTRACT

The invention is a power inverter having a heat dissipating assembly. A heat sink plate is supported on the printed circuit board in a spaced configuration so that a space exists between the heat sink plate and the outer housing. The printed circuit board assembly includes mosfets inserted into the printed circuit board and electrically connected thereto. The heat sink plate abuts against a first side of the mosfets at an upper end of the mosfets to directly absorb heat from the mosfets. The exterior surface of the housing is provided with a plurality of heat dissipating fins to further enable heat dissipation.

13 Claims, 2 Drawing Sheets

POWER INVERTER WITH HEAT DISSIPATING ASSEMBLY

BACKGROUND OF THE INVENTION

1. Field of the Invention

The invention is related to dissipation of heat in a power inverting device. In a power inverting device, heat is generated within the device structure and it is necessary to dissipate the generated heat through a heat sink to an exterior housing. It is important to transfer the heat uniformly by ventilation and cooling techniques and by appropriate housing design.

2. Background of the Related Art

In a conventional power converter, common elements include a housing, an electrical circuit board assembly having power conversion capabilities, and a heat conducting plate attached to the circuit board assembly. Typically the heat conducting plate is mounted in direct contact with the circuit board and housing, either by abutting surfaces, heat conducting screws, or both, to dissipate heat through the housing. This manner of heat dissipation in conventional converters causes the areas of the housing directly in contact with the heat conductor plate to have higher temperatures than those areas of the housing not in contact with the heat conducting plate. This results in uneven heat conduction and inefficient dissipation, even with the use of a cooling fan circulating the air within the housing.

Furthermore, the conventional inverters having such aforementioned abutting surfaces or screwed connections between the heat conducting plate and the housing increase manufacturing requirements and tolerances as a result. Additionally, assembly becomes increasingly difficult. Therefore it is desirable to have an improved product in which the foregoing drawbacks of conventional power converters have been removed. The apparent advantages of the present invention over the above-described prior art and objects thereof follow accordingly.

It is an object of the invention to achieve even heat dissipation in a power converter.

It is a further object of the invention to simplify manufacturing requirements for the elements in a heat dissipating assembly.

It is another object of the invention to increase the ease of assembly of a heat dissipating assembly in a power converter.

A specific object of the invention is to provide air circulation channels between the heat conducting plate and the housing in a heat dissipating assembly.

It is a further object of the invention to extract heat directly from the circuitry of the power inverter into a heat conducting plate.

SUMMARY OF THE INVENTION

The invention is a power inverter having a heat dissipating assembly. The assembly includes a housing having a top wall and two opposing side walls, and a printed circuit board assembly supported within the housing. The printed circuit board assembly comprises a printed circuit board equipped with power converting components. A heat sink plate is supported on the printed circuit board in a spaced configuration so that a space exists between the heat sink plate and the printed circuit board.

The printed circuit board assembly includes a plurality of mosfets inserted into the printed circuit board. The mosfets are connected to the circuitry of the power converting components, and the heat sink plate abuts against a first side of the mosfets at an upper end of the mosfets. This creates the space that exists between the heat sink plate and the printed circuit board. The heat sink plate is secured to the first side of the mosfets by a support bar abutting against an opposing side of the mosfets by screws passing through the support bar and the heat sink plate.

The heat sink plate is L-shaped and a side wall of the heat sink plate is mounted perpendicularly to the printed circuit board. A top wall of the heat sink plate extends above the printed circuit board assembly parallel to the printed circuit board. An interior top surface of the top wall of the housing is substantially parallel to the top wall of the heat sink plate so that a ventilation space exists between the entire top wall of the heat sink plate and the interior top surface of the housing. This ventilation space allows heat from the heat sink plate to dissipate to air in the ventilation space before dissipating to the housing. A second ventilation space exists between the side wall of the heat sink plate and an interior surface of the side wall of the housing adjacent thereto.

The power inverter assembly further includes a front end plate and a rear end plate secured to the housing in a manner so as to enclose the printed circuit board assembly and the heat sink plate. At least one of the front end plate and the rear end plate having a plurality of ventilation holes through which air can pass to and from the interior of the housing. An intake fan may be mounted to one of the front end plate and the rear end plate to intake cooling air and circulate air within the housing. The intake fan serves to increase heat dissipation from the heat sink plate to the air and then to the housing. The front end plate and the rear end plate are also provided with electrical outlets, and on/off switch, and a fuse. A base plate mounted to bottom edges of the two opposing side walls of the housing in a manner so as to enclose the printed circuit board assembly and the heat sink plate within the housing, the front end plate, and the rear end plate.

The invention additionally features the side wall of the heat sink plate having heat dissipating fins extending out from the side wall of the heat sink plate toward the interior surface of the side wall of the housing within the ventilation space existing therebetween. An exterior surface of the housing is provided with a plurality of heat dissipating fins. These fins further enable heat dissipation.

BRIEF DESCRIPTION OF THE DRAWINGS

The above mentioned advantages and objects of the present invention will further become apparent when taken with the detailed description of the invention and with the drawings in which.

DETAILED DESCRIPTION OF THE INVENTION

Figure 1:
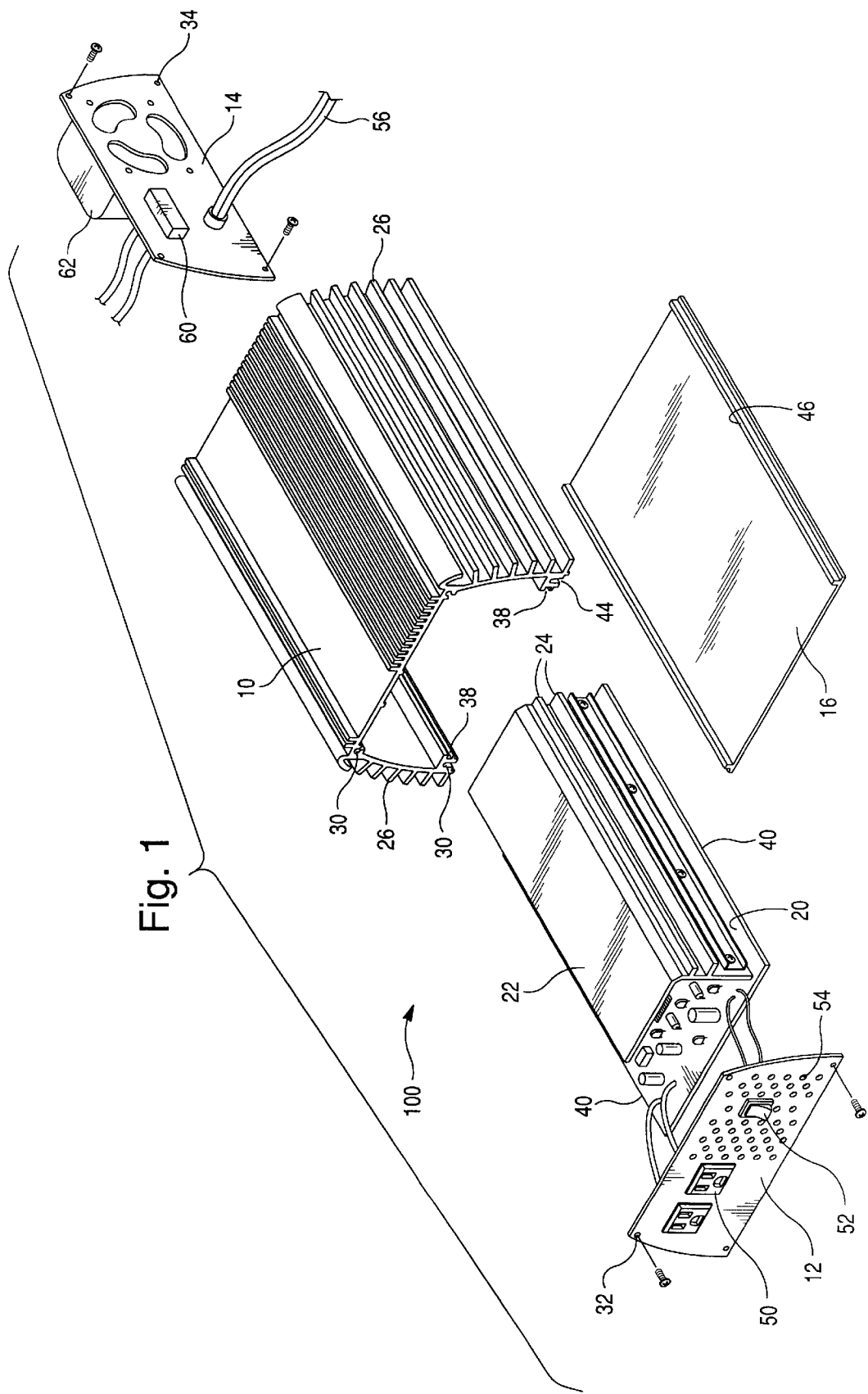
FIG. 1 is an exploded view of a power inverter having a heat dissipating assembly according to the present invention.

Referring now to FIG. 1, a preferred embodiment of the present invention will be described. The main components of the power inverter 100 according to the invention are substantially enclosed within a housing 10, a front cover plate 12, a rear cover plate 14, and a base plate 16. The main components further include a printed circuit board 20 loaded with conventional power converter elements and the appropriate wiring, as will be understood by those skilled in the art. An L-shaped heat sink plate 22 is mounted within the housing in a manner to be described hereinafter. The L-shaped heat sink plate 22 is shown having heat dissipating fins 24 extending along the side length of the plate.

The exterior of the housing 10 has a plurality of heat dissipating fins 26 extending outwardly from the sides and the top of the housing 10. The interior surface 28 of the housing is provided with slotted, threaded screw holes 30 at the upper and lower corners thereof. The front and rear cover plates 12, 14 are provided with corresponding screw holes 32, 34, respectively, which screws 36 pass through to attach the front and rear cover plates to the housing during assembly. Furthermore the interior sides of the housing are provided with opposing elongated mounting slots 38 through which the printed circuit board edges 40 are inserted into lengthwise. The bottom of the housing 10 has parallel elongated slots 44 for mounting the base plate 16 therein. The base plate 16 has corresponding mating edges 46 that fit into the bottom slots 44 of the housing when the edges 46 are inserted and slid into the slots 44 lengthwise. The remaining surfaces of the interior of the housing are smooth and continuous.

In addition to the screw holes 32 for attachment to the housing 10, the front cover plate 12 is provided with power converted outlets 50 or receptacles, an on/off switch 52, and a plurality of ventilation holes 54 that allow air to pass in or out from the housing interior. The rear cover plate 14 is provided with a power cord 56 with an attached adapter (not shown), a fuse 60, and an optional intake fan 62. It will be noted that the power inverter 100 according to the invention does not necessarily require an intake fan. For example, a 350 Watt power inverted may be equipped with an intake fan, whereas a 150 Watt power inverter may not. Accordingly the fan 62 on the rear cover plate 14 may alternatively be replaced by additional ventilation holes.

Figure 2:
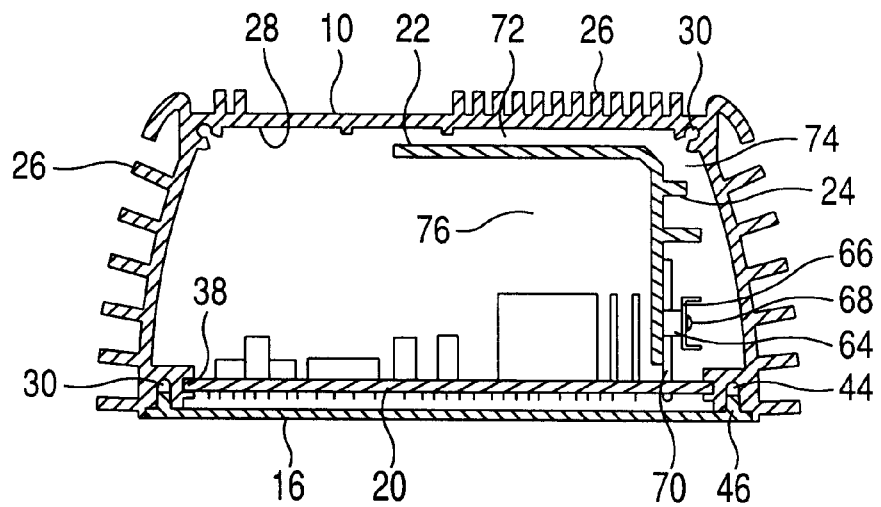
FIG. 2 shows a cross-sectional view of the power inverter shown in FIG. 1.
Figure 3:
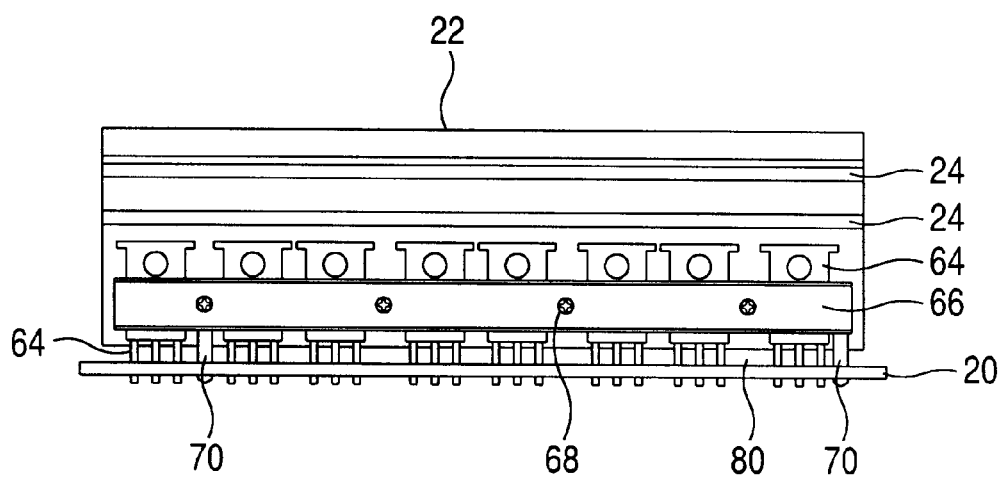
FIG. 3 is a partial perspective view showing the heat dissipating assembly according to the present invention.

The printed circuit board 20 is provided with typical power converter elements and the required wires for attachment to the components provided on the front and rear cover plates 12, 14, as will be understood by those skilled in the art. Referring now to FIGS. 2 and 3, attention however is drawn to the attachment of the heat sink plate 22 to a plurality of mosfets 64. The mosfets 64 are connected with the circuitry of the inverter and extend upward from the printed circuit board. The mosfets 64 generate a substantial amount of heat. Thus the heat sink plate 22 is connected directly to the mosfets fro absorbing heat directly there from. A support bar 66 abuts the mosfets against the side of the L-shaped heat sink plate 22 by screws 68 passing through the bar 66 and into the plate 22. Two supplemental support legs 70 are provided between the printed circuit board 20 and the heat sink plate 22 to support the weight of the heat sink plate. It should be noted that the heat sink plate is supported on the printed circuit board by the support legs in a spaced configuration so that a space 80 exists between the heat sink plate and the printed circuit board.

Several methods are possible for assembly of the power inverter having the heat dissipation assembly according to the invention. For example, during the manufacturing of the printed circuit board 20 the mosfets 64 are inserted into the board. The supplemental support legs 70 are attached to the L-shaped heat sink plate 22 and the legs are also inserted into the board 20. The heat sink plate 22 is positioned by the placement of the support legs 70 in the board 20 such that the plate 22 is abutting the mosfets 64. The support bar 66 is clamped against the mosfets 64 by means of screws 68 to maintain the mosfets against the side wall of the heat sink plate. This ensures that the heat generated in the mosfets will be dissipated from the mosfets by the direct contact with the heat sink plate.

The printed circuit board 20 and its components are fitted into the elongated support slot 38 in the housing 10. The base plate 16 is also fitted onto the bottom of the housing by sliding base plate edges 46 lengthwise into the bottom slot 44 of the housing. The front and rear cover plates 12, 14 and the previously attached elements described above are secured to the housing 10 by the screws passing through screw holes 32, 34 on the covers and into the slotted screw holes 30 on the housing.

Once the assembly of the power inverter is complete it can be seen in FIG. 2 that a ventilation space 72 is provided between the top side of the L-shaped heat sink plate 22 and the interior surface 28 of the housing 100. There is a channel 74 provided between the side of the plate 22 at the heat dissipating fins 24 and the interior side surface of the housing. Furthermore, a space 76 underneath the heat sink plate 22 and above the printed circuit board 20 allows for air circulation within the housing to enable even heat dissipate from the heat sink plate 22 to the interior surface 28 of the housing and thereby to the exterior heat dissipating fins 26. Because there is no contact between the heat sink plate 22 and the housing 10, the present invention has superior heat dissipation capability than the prior art. The heat in the heat sink plate 22 transfers to the surrounding air in the spaces and channels by means of convection, and may even escape through the ventilation holes in the end cover plates before it transfers into the housing. This allows for even distribution of the heat dissipation into the housing and out through the fins of the housing. Therefore, the outside surfaces of the housing remain within a safe temperature if contact with skin. Having thus described various exemplary embodiments of the invention, it will be understood by those skilled in the art that modifications or changes in details of the invention may be implemented without departing from the spirit and scope of the invention as defined in the following claims.

What is claimed is:

1. A power inverter having a heat dissipating assembly, comprising:

a housing having a top wall and two opposing side walls;

a printed circuit board assembly supported within said housing, said printed circuit board assembly comprising a printed circuit board equipped with power inverting components; and a heat sink plate supported on said printed circuit board and adapted to absorb heat therefrom wherein a space exists between the heat sink plate and the housing such that the heat sink plate does not contact the housing, wherein said printed circuit board assembly includes a plurality of mosfets connected to said printed circuit board and extending therefrom, said plurality of mosfets being connected to circuitry of the power inverting components, said heat sink plate abuts against a first side of each of said plurality of mosfets to absorb heat directly therefrom, and said heat sink being connected to said mosfets such that a space that exists between the heat sink plate and the printed circuit board, and wherein said heat sink plate is secured to said first side of the mosfets by a support bar abutting against an opposing side of each of said plurality of mosfets by screws passing through the support bar and the heat sink plate.

2. The power inverter according to claim 1, wherein said heat sink plate is L-shaped and a side wall of the heat sink plate is mounted perpendicularly to the printed circuit board and a top wall of the heat sink plate extends above the printed circuit board assembly parallel to the printed circuit board, and wherein an interior top surface of the top wall of the housing is substantially parallel to the top wall of the heat sink plate and a ventilation space exists between the entire top wall of the heat sink plate and the interior top surface of the housing to allow heat from the heat sink plate to dissipate to air in the ventilation space before dissipating to the housing.

3. The power inverter according to claim 2, further comprising a ventilation space between the side wall of the heat sink plate and an interior surface of the side wall of the housing adjacent thereto.

4. The power inverter according to claim 3, further comprising a front end plate and a rear end plate secured to said housing in a manner so as to enclose said printed circuit board assembly and said heat sink plate, wherein at least one of said front end plate and said rear end plate having a plurality of ventilation holes through which air can pass to and from the interior of the housing.

5. The power inverter according to claim 4, further comprising an intake fan mounted to one of said front end plate and said rear end plate to intake cooling air and circulate air within the housing to increase heat dissipation from the heat sink plate to the air and then to the housing.

6. The power inverter according to claim 3, wherein said side wall of said heat sink plate comprises heat dissipating fins extending out from the side wall of the heat sink plate toward the interior surface of the side wall of the housing within said ventilation space existing therebetween.

7. The power inverter according to claim 4, further comprising one of said front end plate and said rear end plate provided with electrical outlets, and on/off switch, and a fuse.

8. The power inverter according to claim 1, further comprising a front end plate and a rear end plate secured to said housing in a manner so as to enclose said printed circuit board assembly and said heat sink plate, wherein at least one of said front end plate and said rear end plate having a plurality of ventilation holes through which air can pass to and from the interior of the housing.

9. The power inverter according to claim 1, wherein an exterior surface of said housing is provided with a plurality of heat dissipating fins.

10. The power inverter according to claim 4, further comprising a base plate mounted to bottom edges of the two opposing side walls of said housing in a manner so as to enclose said printed circuit board assembly and. said heat sink plate within said housing, said front end plate, and said rear end plate.

11. A power inverter having a heat dissipating assembly, comprising:

a housing having a top wall and two opposing side walls;

a printed circuit board assembly supported within said housing, said printed circuit board assembly comprising a printed circuit board equipped with power inverting components, said power inverter components including a plurality of mosfets extending upward from said printed circuit board; and a heat sink plate connected directly to mosfets for absorbing heat generated there from, said heat sink plate being arranged within said housing such that a space exists between the heat sink plate and the housing without contacting the housing, wherein said heat sink plate is spaced apart from said printed circuit board, and wherein said heat sink plate is secured to a first side of the mosfets by a support bar abutting against an opposing side of each of said plurality of mosfets by screws passing through the support bar and the heat sink plate.

12. The power inverter according to claim 11, wherein said heat sink plate is L-shaped and a side wall of the heat sink plate is mounted perpendicularly to the printed circuit board and a top wall of the heat sink plate extends above the printed circuit board assembly parallel to the printed circuit board, and wherein an interior top surface of the top wall of the housing is substantially parallel to the top wall of the heat sink plate and a ventilation space exists between the entire top wall of the heat sink plate and the interior top surface of the housing to allow heat from the heat sink plate to dissipate to air in the ventilation space before dissipating to the housing.

13. The power inverter according to claim 12, further comprising a ventilation space between the side wall of the heat sink plate and an interior surface of the side wall of the housing adjacent thereto.

* * * * *